United States Patent [19]

Maserjian

[11] Patent Number: 4,818,079

[45] Date of Patent: Apr. 4, 1989

[54] MULTIPLE QUANTUM WELL OPTICAL MODULATOR

[75] Inventor: Joseph Maserjian, La Crescenta, Calif.

[73] Assignee: California Institute of Technology, Pasadena, Calif.

[21] Appl. No.: 149,653

[22] Filed: Jan. 28, 1987

Related U.S. Application Data

[62] Division of Ser. No. 003,633, Jan. 15, 1987, abandoned.

[51] Int. Cl.⁴ .......................... G02F 1/19; G02F 1/21
[52] U.S. Cl. ..................................... 350/354; 350/353
[58] Field of Search ................ 350/354, 355, 356, 353

[56] References Cited

U.S. PATENT DOCUMENTS

| | | | |
|---|---|---|---|
| 4,573,767 | 3/1986 | Jewell | 350/354 |
| 4,626,075 | 12/1986 | Chemla | 350/354 |
| 4,701,030 | 10/1987 | Jewell | 350/354 |

Primary Examiner—Eugene R. LaRoche
Assistant Examiner—Nathan W. McCutcheon
Attorney, Agent, or Firm—Ashen Golant Martin & Seldon

[57] ABSTRACT

Multiple quantum well (MQW) structures (24) are utilized to provide real-time, reliable, high-performance, optically-addressed spatial-light modulators (SLM) (10, 10'). Several embodiments are provided, including combination of MQW structures with PIN photodiodes of GaAs (12) or Si (12') to form two-dimensional arrays of pixel elements (92) on a single chip (90). In another embodiment, the optically-addressed SLM (50) comprises a vertical stack of MQW layers (52) within the penetration depth of an optical write signal (36), a plurality of space charge barriers (52b) having predetermined tunneling times by control of doping and thickness, whereby modulation sensitivity is high and no external voltage source is required. In yet another embodiment, the optically-addressed SLM (70) comprises a multiplicity of quarter-wave layers (72, 74) whose index of refraction is changed by changes in in the fields at the boundaries (80) responsive to the photocurrent generated by the incident write signal. The changes are read by use of a read signal (38) of a wavelength that is resonantly reflected (78) from the quarter-wave layers.

7 Claims, 3 Drawing Sheets

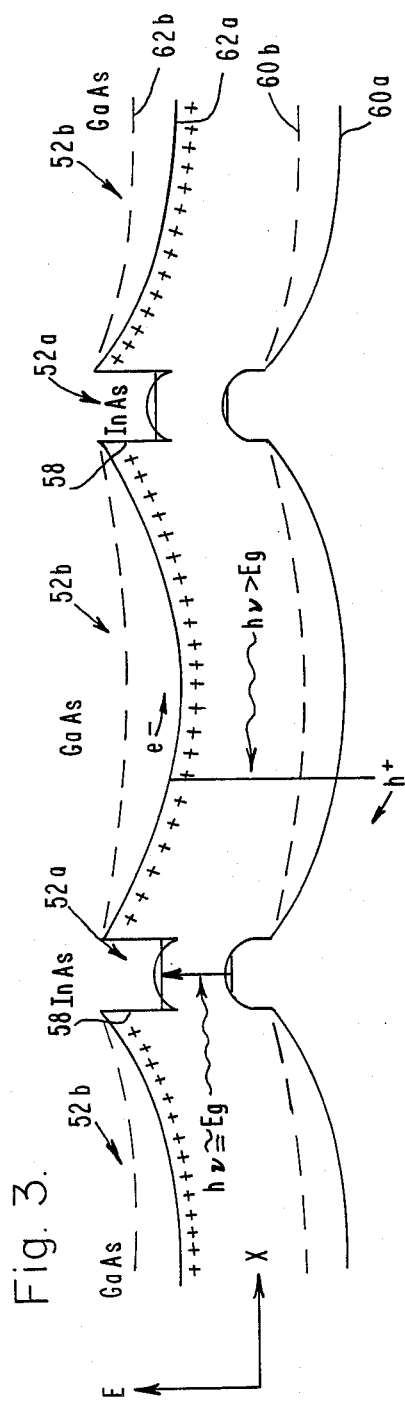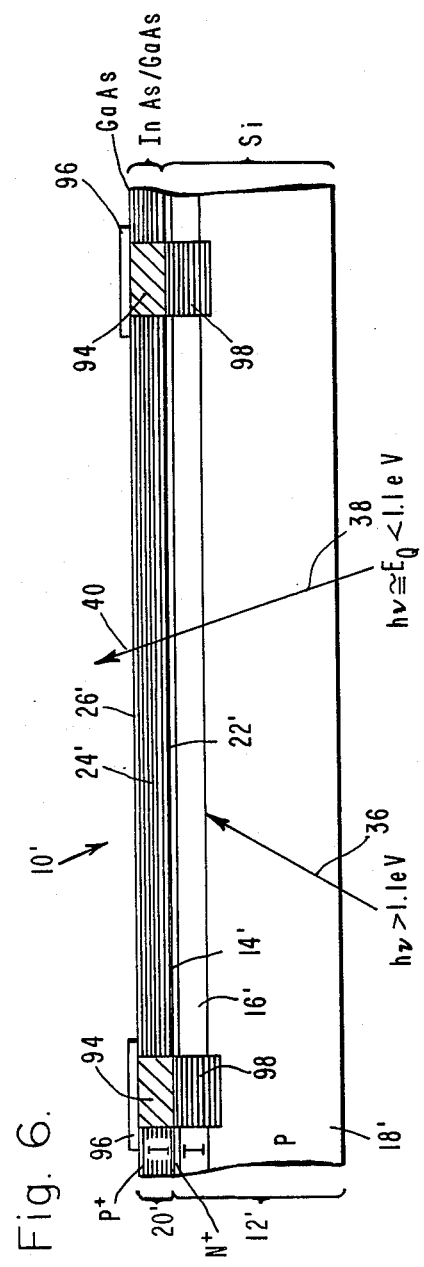

MULTIPLE QUANTUM WELL OPTICAL MODULATOR

This is a division of application Ser. No. 003,633, filed Jan. 15, 1987, now abandoned.

The invention described herein was made in the performance of work under a NASA contract, and is subject to the provisions of Public Law 96-517 (35 U.S.C. 202) in which the Contractor has elected to retain title.

TECHNICAL FIELD

The present application relates to semiconductor modulators, and, in particular, to semiconductor modulators employing multiple quantum wells.

BACKGROUND ART

The formation of ultrathin layers of semiconductor heterostructures (on the order of 50 to 400 Å for (Al,-Ga)-As/GaAs) leads to the quantization of confined carriers. Such ultrathin heterostructures, which usually comprise alternating layers of dissimilar semiconductor materials, are referred to as superlattices or quantum well structures. The energy band diagram for such structures evidences abrupt steps in the energy gap which form potential wells in the conduction and valence bands, as is well-known. Appropriate selection of materials, compositions and layer thicknesses permits fabrication of unique electro-optic devices.

The use of optics to perform signal processing is attractive because of the high speed of light and the opportunity of using many parallel channels, which yield the promise of very high throughput rates. However, a major obstacle to the realization of this goal has been the lack of a real-time, reliable, high performance spatial-light-modulator (SLM). This lack is largely due to the limitations of materials.

DISCLOSURE OF INVENTION

In accordance with the invention, multiple quantum well (MQW) structures are utilized to provide real-time, reliable, high performance, optically-addressed spatial-light-modulators (SLM). Such MQW structures comprise alternating layers of a sandwich material alternating with a host material, the bandgap of the sandwich material being lower than that of the host material. Examples of suitable sandwich/host materials include such III-V systems as InAs/GaAs, (In,Ga)As/GaAs, (In,Ga)As/InP, and (In,Ga)As/(In,Al)As.

Several embodiments are disclosed, including combinations of the MQW structures of the invention with PIN photodiodes of GaAs or Si. The combination of MQW structures and photodiodes can be formed into two-dimensional arrays of pixel elements on a semiconductor chip to form an optically-addressed SLM. An incident optical read signal having an energy less than that of the bandgap of the host material may be modulated by an incident optical write signal having an energy greater than that of the host material. Circuitry on the chip may be used to provide on-chip signal processing.

In another embodiment, the optically-addressed SLM comprises a vertical stack of MQW layers within the penetration depth of an optical write signal, a plurality of space charge barriers having predetermined tunneling times by control of doping and thickness, whereby modulation sensitivity is high and no external voltage source is required.

In yet another embodiment, the optically-addressed SLM comprises a multiplicity of quarter-wave layers whose index of refraction is changed by changes in the fields at the boundaries responsive to the photocurrent generated by the incident write signal. The changes are read by use of a read signal of a wavelength that is resonantly reflected from the quarter-wave layers.

In the additional embodiments, again, an incident optical read signal may be modulated by an incident optical write signal.

Thus, the selection of appropriate materials, having the properties specified above, permit fabrication of high performance, optically-addressed SLMs.

BRIEF DESCRIPTION OF THE DRAWINGS

FIG. 3, on coordinates of length (x) and energy (E), is a plot depicting the energy diagram through five layers of the structure depicted in FIG. 2;

FIG. 6 is a cross-sectional view of an enlarged portion of FIG. 5.

BEST MODES FOR CARRYING OUT THE INVENTION

Recent advances in molecular-beam-epitaxy (MBE) have made possible the growth of new InAs/GaAs strain-layer semiconductor microstructures. This has enabled the opportunity of engineering the material structure with specifically enhanced electro-optical properties, such as the growth of multiple quantum wells (MQWs) and compositional superlattices. These materials also allow free passage of light through a semiconductor substrate, enabling the fabrication of monolithic, optically-addressed spatial-light-modulators (SLMs).

In one embodiment of the invention, a novel real-time, high-performance, optically-addressed spatial-light-modulator comprises a PIN GaAs photodiode grown directly over a PIN multiple quantum well diode, capable of being formed into two-dimensional arrays with conventional lithography and etching to define pixel elements, as shown below. Optional MESFET (metal-semiconductor field effect transistor) circuitry, primarily on the periphery of the GaAs chip, could provide on-chip signal processing.

Figure 1:
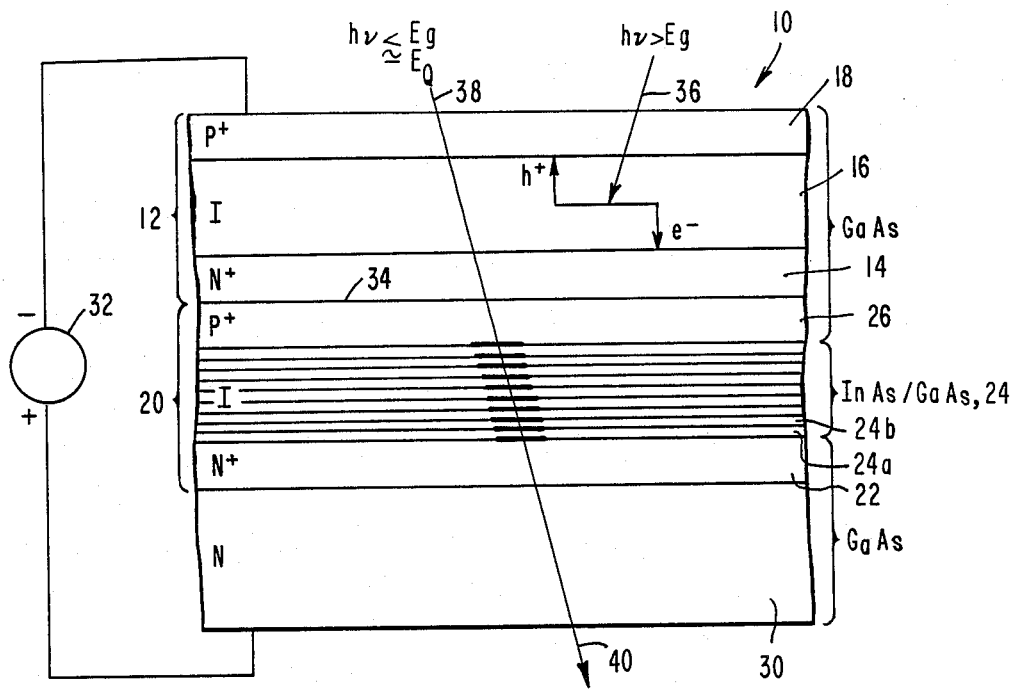
FIG. 1 is a cross-sectional view of a photodiode-coupled multiple quantum well modulator in accordance with one embodiment of the invention.

Referring now to the drawings wherein like numerals of reference designate like elements throughout, FIG. 1 is a cross-sectional view of the structure of the monolithic photodiode-coupled MQW modulator of this embodiment, making use of the quantum-confined Stark effect in MQWs. The MQWs are grown within the undoped region of a PIN diode and comprise alternating layers of two dissimilar semiconductor materials, one called herein the sandwich material and the other the host material.

A similar construction has been demonstrated in (Al,-Ga)As/GaAs for use as an optical modulator as having the capability of being a wavelength selective detector. However, in this material, there are inherent traps, called DX centers, which degrade the performance because of persistent photoconductivity after light stimulus is removed. Also, the photon energy required for exciting the quantum state is larger than the band gap of GaAs, and thus is absorbed within a very thin layer, requiring removal of the GaAs substrate material by etching. This restricts the ability to fabricate monolithic arrays of structures for SLMs.

In the present embodiment, the use of a sandwich material having a lower bandgap than the host material eliminates these limitations. Examples of such lower bandgap sandwich materials/host materials include such III-V systems as InAs/GaAs, (In,Ga)As/GaAs, (In,Ga)As/InP, and $In_yGa_{1-y}As/In_xAl_{1-x}As$. The last system could employ the lattice-matched values of x=0.52 and y=0.53 to minimize strain.

The discussion which follows is directed to a particular III-V system, namely, InAs/GaAs. However, it will be appreciated that the teachings of the invention may be utilized in any system comprising a III-V sandwich material having a lower bandgap than the III-V host material, such as those disclosed above.

Further, many aspects, such as layer thickness and doping levels, have not been fully determined for these systems. Accordingly, the values given herein should be considered to be adequate to a first approximation. It is anticipated that some departure from these values may occur in an attempt to optimize device performance. The optimization of device performance, however, is well within the ability of the person skilled in the art, and will not require undue experimentation.

As depicted in FIG. 1, a monolithic photo-coupled MQW modulator 10 comprises a GaAs PIN photodiode 12 grown directly over an InGa/GaAs PIN MQW diode 20. The monolithic structure 10 is grown on a GaAs substrate 30, doped with an N-type dopant, such as silicon, to a conventional concentration, such as $1 \times 10^{17}$ cm$^{-3}$.

Over the substrate (and an appropriate buffer layer) 30 is formed the first layer of the PIN MQW diode 20, a layer 22 of GaAs doped with an N-type dopant to a high concentration (N+), such as $10^{18}$ to $10^{19}$ cm$^{-3}$. The thickness of layer 22 is on the order of about 0.1 μm. As is customary in the art of III-V devices, a buffer layer is formed on the substrate to improve the surface for growth of additional layers thereon. For clarity, such a buffer layer is not shown separate from the substrate on the Figures herein.

MQW structure 24, comprising a series of alternating layers of undoped InAs (sandwich material) 24a and undoped GaAs (host material) 24b, is formed over the N+ GaAs layer 22. It should be noted that use of the term "undoped" herein means unintentionally doped, since all semiconductor materials include impurities to some extent.

The alternating layers start and end with GaAs layers 24b, sandwiching InAs layers 24a. The thickness of the layers 24a, 24b and of the MQW structure 24 depends on many material factors. For example, in strained materials, such as InGa/GaAs, the strain limits the layer thickness and thus the minimum quantum level ($E_Q$); increasing the thickness decreases $E_Q$. Consequently, the thickness of the InGa layers 24a must be kept small, on the order of 40 Å, so as to avoid undue strain.

The presence of strain may limit the layer thickness, particularly in the case of the InAs/GaAs system. Consequently, other III-V systems which do not evidence the strain of the InA/GaAs system may be preferably employed. On the other hand, especially in connection with other embodiments discussed below, it may be useful to take advantage of the effects of strain on electro-optic properties. Accordingly, in such cases, the thickness value of about 40 Å for InAs layers may be suitably adjusted for the desired result.

While the thickness of the GaAs layers 24b is not so constrained, it is desirable to provide as many alternating layers of InGa and GaAs as possible without undue light absorption. For example, for a MQW structure about 1 μm thick, which is a suitable thickness to achieve the desired effect without undue light absorption, 100 quantum wells (a layer of InAs and a layer of GaAs), each well being about 100 Å thick, may be formed.

Another factor that governs the thickness of the MQW structure 24 is the level of doping. If the doping is on the order of $10^{15}$ cm$^{-3}$ or less, then the thickness of layer 24 may be a few micrometers thick. However, if the doping is on the order of $10^{16}$ cm$^{-3}$, then the thickness of layer 24 is limited to less than about 1 μm. For purely intrinsic materials, a thicker MQW structure 24 permits increased interaction with impinging light.

Finally, the PIN structure ends with a P+ layer 26 of GaAs, employing a P-type dopant, such as beryllium. The thickness and dopant level of layer 26, like that of layer 22, are conventional, and are typically about 0.1 μm and $10^{18}$ to $10^{19}$ cm$^{-3}$, respectively. However, in this case, a maximum doping on the order of $10^{19}$ cm$^{-3}$ is required in order to form a tunnel contact with layer 14. The use of highly doped P+ layer 26 and highly doped N+ layer 14 shorts out the junction 34 formed therebetween and permits stacking of the PIN photodiode 12 on the PIN MQW 20.

The PIN photodiode 12 is then formed, comprising N+ GaAs layer 14 formed on the P+ layer 26, followed by an undoped GaAs layer 16 formed on layer 26, and a P+ GaAs layer 18 formed on layer 16. The thickness and doping levels of layers 14, 16 and 18 are conventional, except for the high doping required in layer 14 to form the tunnel contact to layer 26 described above. Typical values are as follows: layer 14, about 0.1 μm thick and about $10^{19}$ cm$^{-3}$ doping; layer 16, about 1 to 2 μm thick (depending on dopant level, as described above); layer 18, about 0.1 μm thick and about $10^{18}$ to $10^{19}$ cm$^{-3}$ doping.

It will be appreciated that the PIN photodiode 12 and PIN MQW 20 may be formed on a GaAs substrate/buffer layer 30 doped with a P-type dopant. In such a case, the doped layers of the PIN photodiode 12 and PIN MQW 20 would be reversed.

An external voltage source 32 is applied to substrate 30 and layer 18 to bias the PIN photodiode 12.

The InAs/GaAs layer containing the multiple quantum wells 24 permits a write signal 36 to be absorbed in the PIN photodiode 12 at photon energies larger than the GaAs bandgap $E_g$. The read signal 38 would be at energies below $E_g$, but close to $E_Q$, and thus could be transmitted through the GaAs substrate 30, without requiring excessive thinning of the substrate.

The write signal 36, which impinges on the undoped layer 16, charges the N+/P+ node 34 with the integrated photo current, increasing the field across the MQW device 20, thus acting as a gate for the read signal 38. The charge (and field) are removed by cycling the voltage from V to 0 with the voltage source 32, at a preselected integrating time. The InAs/GaAs material system offers the flexibility of tailoring the quantum level to longer wavelengths associated with fiber optics, such as 1.3 or 1.55 μm.

The effect of using the photodiode 12 in conjunction with the MQW device 20 is that an incoherent light signal 38 may be converted to a coherent light signal 40. On the other hand, a coherent light signal 38 can also provide a modulated light output 40.

There are many other optical processing applications for devices such as depicted in FIG. 1 and as disclosed in the other embodiments below. For example, an incoming optical signal could be compared with a reference signal to make an optical correlation, with gating of the incoming signal if it correlates to the reference signal.

The structure described above could be fabricated into two-dimensional arrays for optically-addressed SLMs, using conventional lithographic and etching techniques for defining pixel elements. Such arrays are described in further detail below in connection with FIG. 5. In addition, MESFET circuitry could be added on the GaAs chip, for on-chip data processing, as also discussed in greater detail below.

In a second embodiment of the invention, a novel real-time, high performance, optically-addressed SLM comprises a vertical stack of multiple quantum well layers within the penetration depth of an optical write signal, a plurality of space charge barriers having predetermined tunneling times by control of doping and thickness, whereby modulation sensitivity is high and, in contrast to the embodiment described above, no external electrical contacts or voltage source 32 is required.

Figure 2:
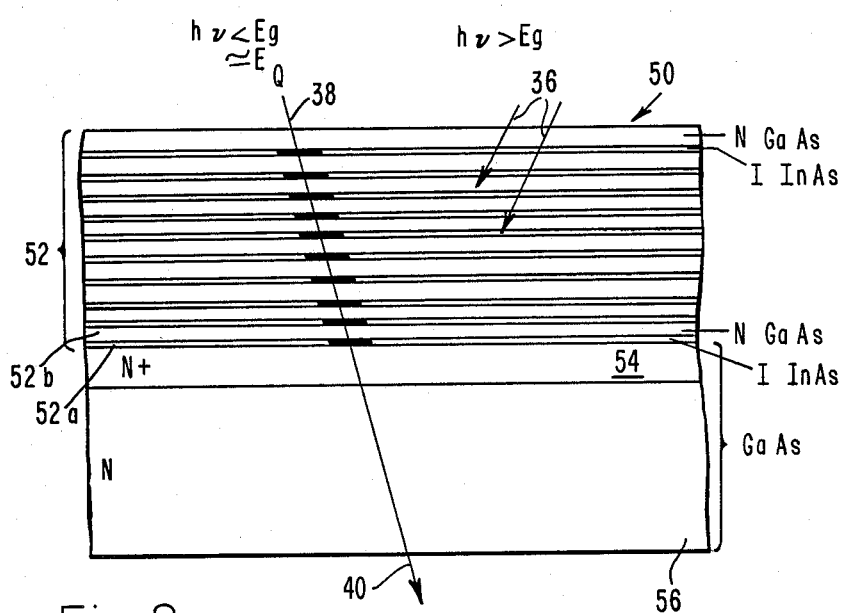
FIG. 2 is a cross-sectional view of a photovoltaic-driven multiple quantum well modulator in accordance with another embodiment of the invention.

FIG. 2 is a cross-sectional view of the second embodiment of the invention, and FIG. 3 is an energy diagram of a portion of the structure shown in FIG. 2.

Shown in FIG. 2 is a photovoltaic-driven MQW modulator 50 comprising a structure 52 of a plurality of alternate layers of undoped InAs 52a and selectively-doped N GaAs 52b. The MQW structure 52 is formed on a buffer layer 54 comprising N+ GaAs, which in turn is formed on a GaAs substrate 56, doped with an n-type dopant. The substrate doping should not be important, but doping may be necessary to provide a ground plane or equipotential plane to drain off charge accumulation through the substrate and avoid hysteresis effects. The MQW structure 52 begins with an undoped InAs layer 52a on the buffer layer 54 and ends with an N GaAs layer 52b.

The undoped InAs layers 52a are very thin, on the order of about 40 Å or less for the reasons described earlier. However, since the thickness of this layer 52a adjusts the exciton level, an unstrained system, such as (In,Ga)As/InP, might be a reasonable alternative materials system.

As indicated above, where it is desirable to minimize strain, InAs layers will probably be less than about 40 Å thick, based on what is presently known regarding this system. Other III-V alloys, not so strained, may permit fabrication of layers between about 100 to 200 Å in thickness, which is a more preferred value for this device.

On the other hand, it may be desirable to take advantage of strain, since it is predicted to create an enhanced electro-optic effect. Thicker layers result in a strain-enhanced electro-optic effect, but since overlap of the wave functions of the layers is required for MQW devices, the thickness of such strain layers would still reside in the range of about 100 to 200 Å.

The alternating N GaAs layers 52b are considerably thicker, on the order of about 600 to 800 Å. The sheet doping is on the order of about $10^{12}$ cm$^{-2}$. Preferably, a selectively-doped profile is employed across the thickness of each layer 52b, most preferably undoped at the boundaries and doped in the center thereof. If such selective doping is employed, the extent of doping may be on the order of about $2 \times 10^{18}$ cm$^{-3}$ over about 50 Å, and the thickness of the layer 52b may be reduced to about 300 to 500 Å. Such a decrease in thickness for layers 52b permits stacking of more alternating layers 52a, 52b, which results in a desirable increase in the number of quantum wells provided by layer 52a.

The buffer layer 54 is about 0.5 μm thick, and is selectively doped adjacent the first InAs layer 52a to the same extent as the N layers 52b. The underlying region may be uniformly doped to about $10^{18}$ cm$^{-3}$.

Again, as described earlier, a P-doped substrate 56, P+ buffer layer 54 and P layers 52b may alternatively be employed.

As with the embodiment described above, the write signal 36 modulates the read signal 38. It should be noted that the stacking of the MQWs 52a is within the penetration depth of the optical write signal 36 of about 1 to 2 μm.

The photocurrent generated by the write signal 36 produces a very large field change, on the order of $10^5$ V/cm, at the boundaries of the quantum wells 52a. In addition, the symmetric form of the field at the quantum well boundaries 58 should lead to large shifts of the quantum levels, and thus of the exciton resonant energy $E_Q$.

In operation, shown in FIG. 3, the valence and conduction bands assume the profiles shown at 60a and 62a, respectively, in the absence of write signal 36. With the write signal 36 turned on, electron-hole (e$^-$—h$^+$) pairs are created and the valence and conduction bands charge up to assume the profiles shown at 60b and 62b, respectively. The doping of the GaAs layer 52b is shown as uniform across the layer.

The integration/relaxation time of the system is determined by tunneling through the N-doped space charge barriers 62, which can be predetermined by choice of doping distribution and layer thickness. For example, at a given layer 52b thickness, the barrier tunneling time can be increased (to achieve longer integration times) by concentrating the dopant near the middle of the layers, in the preferred doping profile described above. Although the number of MQW layers 52a that can be stacked is limited by the penetration depth of the write signal 36, modulation sensitivity is high.

The advantage of the device 50 is that fields greater than $10^5$ V/cm may be employed, since the fields are internally generated and thus no breakdown is possible. The only external inputs are optical, in contrast to the first embodiment described above.

In yet another embodiment, a novel real-time, high-performance, optically-addressed SLM is provided comprising a multiplicity of quarter-wave layers whose index of refraction is changed by changes in the fields at the boundaries responsive to photocurrents generated by an incident write light signal. The changes are read by use of a read light signal of a wavelength that is resonantly reflected from the quarter-wave layers.

In the prior art, most modulators have been fabricated using lattice-matched materials; it has been assumed that lattice matching is required to achieve reasonable electrical quality. Recent efforts have shown that high quality can be obtained with a lattice mismatch up to about 1.5%. Further, a high structural quality InAs/GaAs lattice with mismatch of more than 7% has recently been produced using diffraction-controlled MBE growth techniques. The strain is confined to the InAs layer (in sufficiently thin layers of about 40 Å or less, giving rise to a strong tetrahedral distortion of the layer. This distortion causes strong modifications of the electronic band structure and has been predicted to lead to drastically-enhanced electro-optical effects. This work has been described by C. Mailhot and D.L. Smith, Paper WEA-4, presented at Physics and Chemistry of Semiconductor Interfaces 13, Pasadena, CA (Jan. 28-30, 1986).

Figure 4:
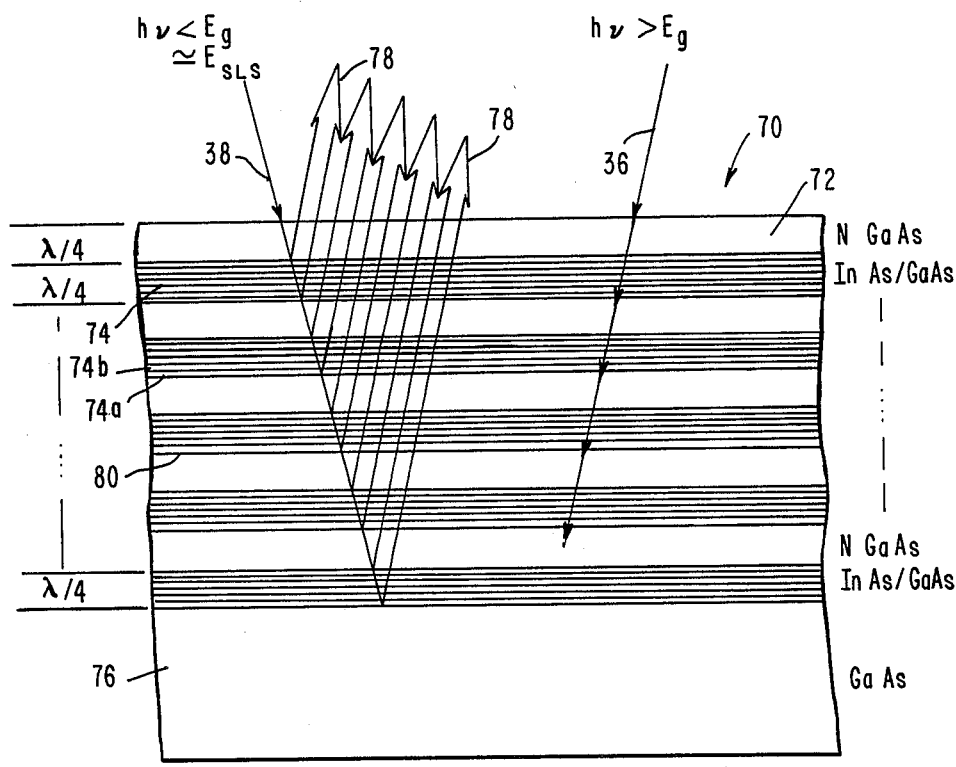
FIG. 4 is a cross-sectional view of a photovoltaic-driven strain-layer-superlattice modulator in accordance with yet another embodiment of the invention.

FIG. 4 is a cross-section of a photovoltaically-driven strain-layer-superlattice modulator 70 of this embodiment, which accomplishes optical modulation upon electro-reflectance. The modulator 70 comprises alternating layers of N GaAs 72 and InAs/GaAs superlattice 74. The modulator 70 is formed on a GaAs substrate 76, as above. Again, P-type doped materials may alternately be employed.

The N GaAS layers 72 are doped as above, and preferably are selectively doped as in layers 52b, above. The thickness of the layers 72 is one-fourth of the wavelength in the material of the incident read optical signal 38.

The InAs/GaAs layers 74 comprise a strain-layer-superlattice of alternating InAs layers 74a and GaAs layers 74b. Again, the thickness of the layers 74 is one-fourth of the wavelength of the incident read optical signal 38.

The maximum thickness of the InAs layers 74a depends upon the strain, it being desired to enhance strain in this embodiment. Accordingly, the thickness of the InAs layers 74a is the maximum attainable, for example, on the order of about 40 Å.

The thickness of the GaAs layers 74b may, as before, be any value, but with the constraint that it is desired to have as many repeating units in a layer 54 as possible. Consistent with these considerations, the thickness of the GaAs layers 74b may be about the same thickness as the InAs layers 74a.

The limitation of the thickness of the GaAs layers 74b to about that of the thickness of the InAs layers 74a is to avoid relieving cumulative strain, which would occur with considerably thicker GaAs layers. Thus, two sources of strain, that from the individual InAs layers 74a and that from the superlattice layer 74, are utilized in the fabrication of the device of this embodiment.

Both the InAs layers 74a and the GaAs layers 74b are undoped.

Resonant reflections of the incident read light signal 38 are returned from quarter-wave optical reflection layers. In particular, the reflectance 78 is from the boundary 80 between each N GaAs layer 72 and each InAs/GaAs superlattice layer 74.

The wavelength in the layers 72 and 74 is given by the free space value divided by the refractive index of the layers. The field at the layer boundaries 80 is modulated by the photocurrent generated by the write signal 36, which can cause large changes at the boundaries of the quarter-wave layers 74 comprising the InAs/GaAs strained-layer-superlattices. Each quarter-wave layer 74 exhibits a strong resonant reflection 78, further reinforced by the multiple quarter-wave layers 72, 74. Changes in the index of refraction, induced by the field, correspondingly change the optical path length in the layers 74, and thus modulate the reflectance 78.

Operation of the device 70 is limited by absorption distance, which limits the number of layers 72, 74. By choosing the write signal 36 close to the band edge, more layers 72, 74 may be utilized.

The read signal 38 is chosen to be slightly below the strained-layer-superlattice bandgap $E_{SLS}$ so that it is not absorbed, but sees the maximum change in refractive index for reflectance.

The above configuration which combines the quantum effect with the resonant and photovoltaic effects, should result in about 10% of the incident read signal 38 being reflected as the modulated output signal 78. This compares with a reflectance of about 1% for the prior art (Al,Ga)As/GaAs system, which does not have the resonant enhancement relied upon herein. With the addition of strain in the MQW structure 74 via InAs layers 74a, an enhanced modulation of up to 100% of the incident read signal 38, forming the output signal 78, may be possible.

In a still further embodiment, a novel real-time, high performance, optically-addressed SLM comprises a PIN MQW diode grown directly over a PIN silicon photodiode, capable of being formed into two-dimensional arrays with conventional lithography and etching to define pixed elements. Optional silicon circuitry, primarily on the periphery of the silicon chip, could provide on-chip processing.

It has recently been shown that device quality GaAs can be grown on silicon substrates, and that resulting misfit dislocations generated by the GaAs/Si lattice mismatch (4%) can be localized in the region of the interface. After growth of this extended buffer layer of sufficient quality, the InAs/GaAs structures may be grown.

Figure 5:
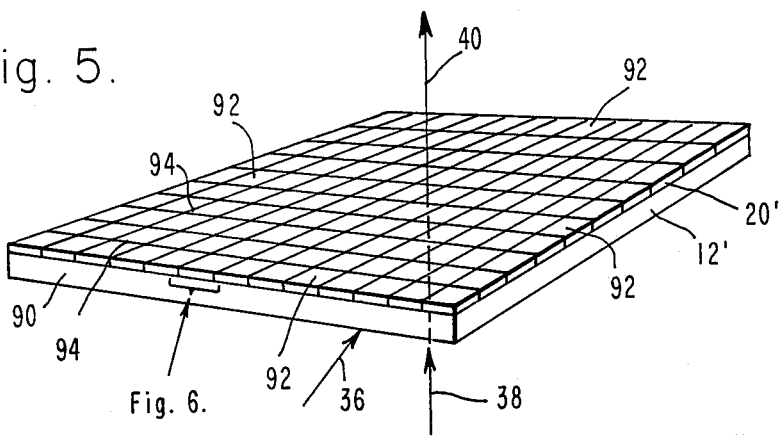
FIG. 5 is a perspective view of a monolithic III-V/silicon modulator in accordance with still another embodiment of the invention.

FIG. 6, which is an enlargement of a portion of FIG. 5, is a cross-sectional view of the modulator 10' of this embodiment and is analogous to that depicted in FIG. 1. However, in this case, the structure is inverted; that is, PIN MQW 20' is grown on top of PIN photodiode 12', which in this embodiment comprises silicon, rather than gallium arsenide.

The PIN photodiode 12' comprises a P-doped Si layer, here, substrate 18', doped at typically $10^{18}$ to $10^{20}$ cm$^{-3}$. An undoped Si layer 16' is formed on the layer 18', and an N+ Si layer 14' is formed on the undoped layer, typically, 0.1 μm thick and $10^{18}$ to $10^{20}$ cm$^{-3}$ N-type doping.

The PIN MQW 20' comprises a buffer layer 22' of N+ GaAs formed on the N+ Si layer 14'. An MQW structure 24' comprises a plurality of alternating layers of undoped InAs 24a' and undoped GaAs 24b', formed on the buffer layer 22'. Finally, the PIN structure 20' ends with a P+ layer 26' of GaAs. The doping levels and thicknesses of the respective layers are as given earlier for the PIN MQW structure 20.

Since the MQW energy $E_Q$ can be tailored to be below the silicon bandgap of 1.1 eV, the read signal 38 can be transmitted through the silicon substrate 18', similar to the transmission through the GaAs substrate 30 of the device 10 of FIG. 1. In all respects, the operation of the two devices 10, 10' is analogous.

The use of the silicon substrate 18' opens up the possibility of a wide range of on-chip processing, such as data coding, decoding, level restoration, spatial reformating, rescaling, and baseline subtraction, by addition of silicon circuitry fabricated on the same substrate. This on-chip circuitry is not shown in FIG. 5, but could be located primarily at the periphery of the chip.

The structure depicted in FIG. 6 is compatible with high pixel densities (e.g., 1000×1000) fabricated with conventional lithography on single chips 90 of about 2 cm square. Well-known etching techniques can be employed to produce pixel arrays 92, as shown in FIG. 5. An insulated region 94 is formed between each pixel element 92, with a metal interconnect 96 commonly connecting each element and with interconnects 98 to on-chip circuitry.

The insulated region 94 may comprise proton-implantation of the III-V material or an etched groove filled with a deposited polyimide or some combination of local silicon oxidation (LOCOS) and deposited dielectrics, as is well-known.

The InAs/GaAs system offers the possibility of tailoring to 1.3 to 1.5 μm wavelengths, which are attractive for optic fiber technology. Of course, the other preferred systems described above may also be suitably employed in the practice of this embodiment.

INDUSTRIAL APPLICABILITY

The various embodiments of the optically-addressed spatial-light-modulators described herein will find use in a variety of electro-optic applications.

Thus, optically-addressed spatial-light-modulators have been disclosed in a host material which employ multiple quantum wells comprising alternating layers of a sandwich material and the host material, the sandwich material having a bandgap lower than that of the host material. It will be apparent to one of ordinary skill in the art that various changes and modifications may be made without departing from the spirit and scope of the invention, and all such changes and modifications are intended to fall within the scope of the invention, as defined by the appended claims.

What is claimed is:

1. A resonant structure evidencing an enhanced electro-optic effect comprising a multiplicity of alternating quarter-wave layers of a first material and a superlattice structure comprising alternating layers of said first material and a second material having a bandgap less than that of said first material, said superlattice structure having an index of refraction which is changed by changes in the fields at the boundaries responsive to the photocurrent generated by an incident write signal, said changes being read by use of a read signal of a wavelength that is slightly below the bandgap of said superlattice and is resonantly reflected from said quarter-wave layers.

2. The structure of claim 1 wherein said first material comprises gallium arsenide and said superlattice structure comprises alternating layers of indium arsenide and gallium arsenide.

3. The structure of claim 1 wherein said first material comprises gallium arsenide and said superlattice structure comprises alternating layers of indium gallium arsenide and gallium arsenide.

4. The structure of claim 1 wherein said first material comprises indium phosphide and said superlattice structure comprises alternating layers of indium gallium arsenide and indium phosphide.

5. The structure of claim 1 wherein said first material comprises indium aluminum arsenide and said superlattice structure comprises alternating layers of indium gallium arsenide and indium aluminum arsenide.

6. The structure of claim 5 wherein said first material comprises $In_xAl_{1-x}As$ and said superlattice structure comprises alternating layers of $In_yGa_{1-x}As$ and $In_xAl_{1-x}As$, where $x=0.52$ and $y=0.53$.

7. The structure of claim 1 wherein said superlattice structure additionally comprises layers of said second material having a substantial lattice misfit and a thickness sufficient to induce strain in said superlattice structure to further enhance said electro-optic effect.

* * * * *